United States Patent
Su

(10) Patent No.: US 11,145,376 B1
(45) Date of Patent: Oct. 12, 2021

(54) MEMORY SYSTEM AND METHOD CAPABLE OF PERFORMING WEAR LEVELING

(71) Applicant: MACRONIX INTERNATIONAL CO., LTD., Hsinchu (TW)

(72) Inventor: Chun-Lien Su, Taichung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/830,519

(22) Filed: Mar. 26, 2020

(51) Int. Cl.
*G11C 16/34* (2006.01)
*G11C 16/16* (2006.01)
*G06F 9/30* (2018.01)
*G06F 13/16* (2006.01)
*G11C 16/26* (2006.01)

(52) U.S. Cl.
CPC ........ *G11C 16/349* (2013.01); *G06F 9/30101* (2013.01); *G06F 13/1668* (2013.01); *G11C 16/16* (2013.01); *G11C 16/26* (2013.01)

(58) Field of Classification Search
CPC ....... G11C 16/349; G11C 16/26; G11C 16/16; G11C 13/0035; G11C 11/40607; G06F 9/30101; G06F 13/1668; G06F 2212/7211; G06F 3/0616; G06F 12/16
See application file for complete search history.

(56) References Cited

U.S. PATENT DOCUMENTS

| | | | |
|---|---|---|---|
| 9,153,337 B2 * | 10/2015 | Sutardja | G06F 12/0246 |
| 10,643,730 B1 * | 5/2020 | Steiner | G11C 29/021 |
| 2020/0159619 A1 * | 5/2020 | Oh | G11C 13/0035 |

* cited by examiner

*Primary Examiner* — Ajay Ojha
(74) *Attorney, Agent, or Firm* — McClure, Qualey & Rodack, LLP

(57) ABSTRACT

A system includes a nonvolatile memory and a controller. The nonvolatile memory includes memory blocks. The controller is configured to perform at least one wear leveling operation, based on at least one degradation curve, to at least one of the plurality of memory blocks. Furthermore, a method associated with wear leveling is also disclosed herein.

21 Claims, 6 Drawing Sheets

MEMORY SYSTEM AND METHOD CAPABLE OF PERFORMING WEAR LEVELING

TECHNICAL FIELD

The present disclosure relates generally to semiconductor memory devices. More particularly, the present disclosure relates to a semiconductor memory device capable of performing a wear leveling operation.

DESCRIPTION OF RELATED ART

For a memory device, the number of times for data stored in the memory device could be limited because the memory device may be worn by write and erase operations of the memory device. Explained in a different way, if wear of a specific portion of the memory device increases because of frequent write and/or erase operations in that specific portion of the memory device, the performance of the memory device may degrade. As the wear as mentioned above becomes serious, data storage capability of the specific portion may be completely disabled, thus reducing a lifetime of the memory device. To address the above issues, and to lengthen the lifetime of the memory device, the wear is maintained uniform across the entire memory device, which is referred to as "wear leveling" in some approaches.

SUMMARY

An aspect of the present disclosure is related to a system that includes a nonvolatile memory and a controller. The nonvolatile memory includes memory blocks. The controller is configured to perform at least one wear leveling operation, based on at least one degradation curve, to at least one of the memory blocks.

Another aspect of the present disclosure is related to a method including: comparing a maximum erase count associated with memory blocks in a nonvolatile memory with a first erase count threshold that is determined based on at least one degradation curve; and when the maximum erase count is greater than the first erase count threshold, performing at least one wear leveling operation to at least one of the memory blocks.

Still another aspect of the present disclosure is related to a method including: comparing erase counts associated with memory blocks in a nonvolatile memory with an activation count threshold; when one of the erase counts is greater than the activation count threshold, determining a first erase count threshold according to at least one degradation curve associated with the memory blocks; comparing a maximum erase count associated with the memory blocks with the first erase count threshold; and when the maximum erase count is greater than the first erase count threshold, performing at least one wear leveling operation to at least one of the memory blocks.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
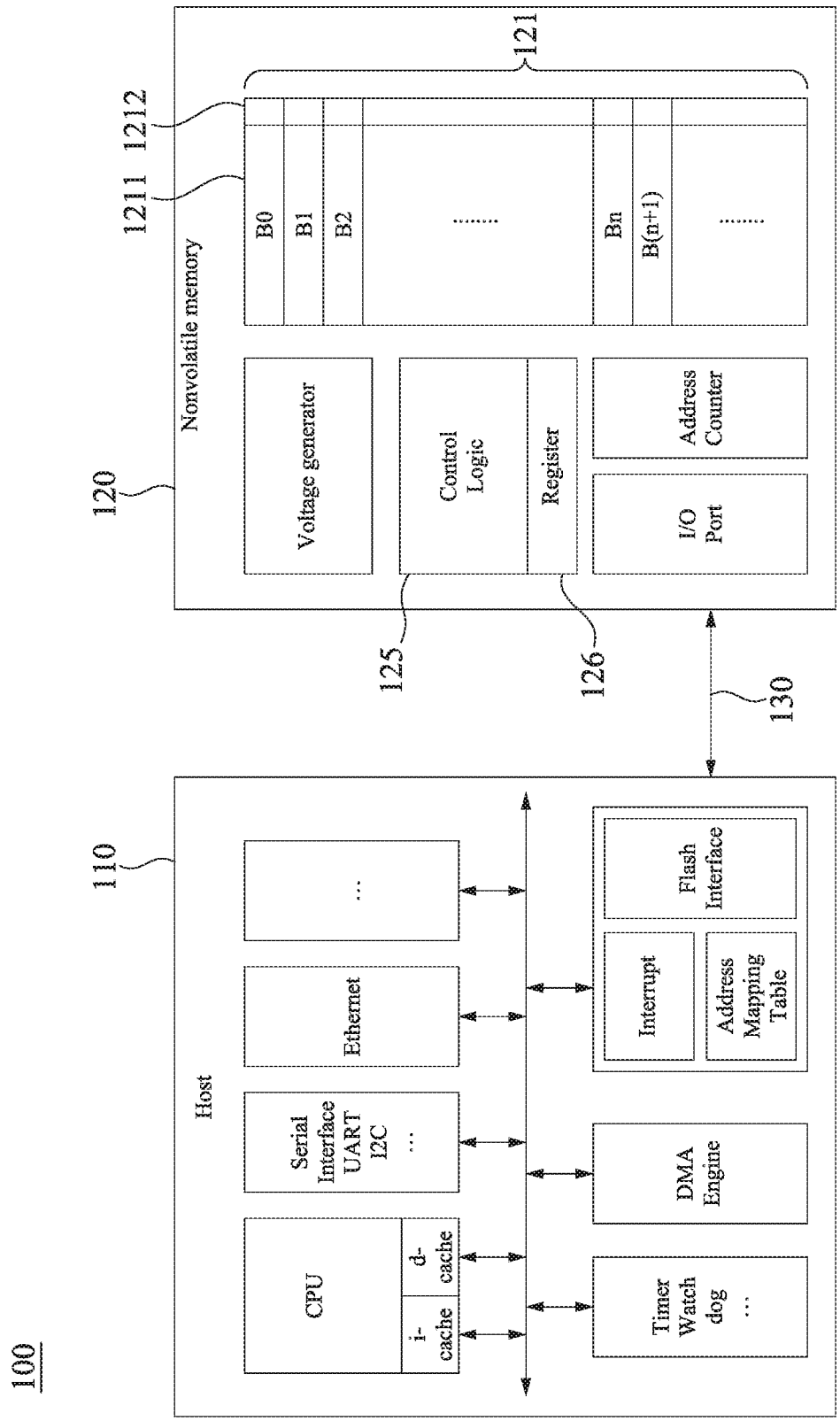
FIG. 1 is a circuit block diagram of a system in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used hereinafter, the term "and/or" includes any and all combinations of one or more of the associated listed items.

For a memory device, if wear of a specific portion of the memory device increases because of frequent write and/or erase operations in that specific portion of the memory device, the performance of the memory device may degrade. As the wear becomes serious, data storage capability of the specific portion may be completely disabled, thus reducing a lifetime of the memory device. To lengthen the lifetime of the memory device, the wear is maintained uniform across the entire memory device, which is referred to as "wear leveling" hereinafter and in the art.

In the embodiments described in the present disclosure, the term "memory" or "memory device" may be referred to as a phase-change random access memory (PRAM), a magnetic RAM, a ferroelectric RAM, a flash memory, or the like. The types of memory are not limiting of the present disclosure.

In some embodiments of the present disclosure, a wear leveling operation is performed, for example, by means of controller software, firmware, control logic hardware, or a combination thereof, in relation to realistic degradation experienced by the memory device. By performing the wear leveling operation based on the realistic degradation behavior of the memory device, lifetime of the memory device can be improved. In addition, too many unnecessary erase and data moving operations would not be required, and memory system response time and overall I/O performance can be improved as well. Details of the embodiments of the present disclosure are given for illustration below.

FIG. 1 is a circuit block diagram of a system 100 in accordance with some embodiments of the present disclosure. As illustrated in FIG. 1, the system 100 includes a host circuit 110 and a nonvolatile memory 120 that is separate from the host circuit 110. The host circuit 110 is configured to execute a sequence of computer executable instructions/commands. The host circuit 110 communicates with the nonvolatile memory 120 through a system bus 130.

In some embodiments, the nonvolatile memory 120 is implemented by a flash memory. The above implementation of the nonvolatile memory 120 is given for illustrative purposes. Various implementations of the nonvolatile memory 120 are within the contemplated scope of the present disclosure.

As illustrated in FIG. 1, the nonvolatile memory 120 includes a memory array 121, and the memory array 121 includes memory blocks B0, B1, B2, . . . , Bn, B(n+1), and so on, which are arranged in columns and/or rows. In some embodiments, each one of the memory blocks in the memory array 121 includes memory cells (not shown), and each one of the memory cells is configured to store bit data.

For simplicity of illustration, FIG. 1 only shows the memory blocks B0-B(n+1) that are arranged in one column, and the memory blocks B0-B(n+1) are used for explanation of the present disclosure. Additional memory blocks and/or various configurations of the memory blocks in the memory array 121 are within the contemplated scope of the present disclosure.

In the embodiments of FIG. 1, the host circuit 110 is configured as a controller for controlling the nonvolatile memory 120, including the execution of a wear leveling method which will be detailed below with reference to FIGS. 3-5. In some embodiments, the host circuit 110 is configured to perform at least one wear leveling operation, based on at least one degradation curve that is associated with the memory blocks B0-B(n+1), to at least one of the memory blocks B0-B(n+1). The wear leveling operation is performed by moving only one memory block, a portion of one memory block, or a group of memory blocks, and this depends on requirements of response time because it takes time to perform wear leveling operation by copying data internally in the nonvolatile memory 120. In some embodiments, the wear leveling operation is performed when the system 100 is idle or not busy. In alternative embodiments, the wear leveling operation is scheduled to be performed periodically.

In some embodiments, the above mentioned degradation curve describes a degradation behavior of the memory blocks B0-B(n+1). The degradation behavior can be extracted and configured/stored in the nonvolatile memory 120 by chip vendors at factory or by users in the field. However, storing the above degradation curve in the nonvolatile memory 120 is given for illustrative purposes. There is even no such specific degradation curve stored in the nonvolatile memory 120, in some embodiments. For example, users can perform the wear leveling algorithm based on a general and/or hypothetical degradation behavior of the memory blocks B0-B(n+1).

In various embodiments, the above mentioned degradation curve indicates a degradation of a threshold voltage of at least one of the memory blocks B0-B(n+1) along with an increase of the erase count associated with at least one of the memory blocks B0-B(n+1), which will be exemplarily discussed below with reference to FIG. 2.

Figure 2:
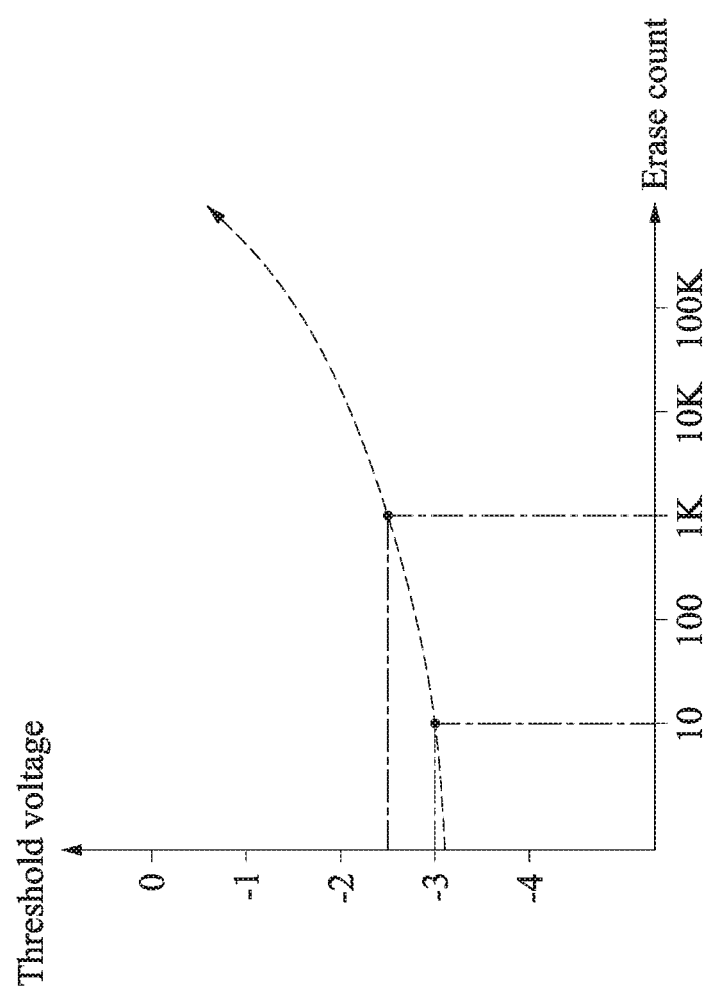
FIG. 2 is a diagram of a degradation curve associated with the memory blocks in FIG. 1, in accordance with some embodiments of the present disclosure.

FIG. 2 is a diagram of a degradation curve associated with the memory blocks in FIG. 1, in accordance with some embodiments of the present disclosure. As illustrated in FIG. 2, the X-axis represents the erase count in log scale having the base of 10, in which the numbers of 10, 100, 1K, 10K, and 100K are labeled along the X-axis, where K in FIG. 2 means the number "1000". The Y-axis represents the threshold voltage associated with the memory blocks.

As illustrated with respect to the degradation curve of FIG. 2, the absolute value of the threshold voltage decreases when the erase count increases. In some embodiments with respect to FIG. 2, the decrease of the threshold voltage indicates the degradation of the memory blocks in FIG. 1. Accordingly, when the erase count increases, it takes a multiple of times to apply operation voltage to the memory blocks, or to raise the applied bias to achieve the required voltage, in order to perform, for example, the erase operation. Based on the above, the degradation curve of FIG. 2 indicates the degradation of the threshold voltage associated with the memory blocks, which corresponds to the increase of the erase count associated with the memory blocks. As illustrated in FIG. 2, the relationship between the threshold voltage and the erase count is non-linear and/or logarithmic, in some embodiments.

In some embodiments, the degradation curve as illustrated in FIG. 2 is generated by performing test in advance on the nonvolatile memory 120 of FIG. 1, and is then encoded into the nonvolatile memory 120. The above test and/or encoding are performed, for example, in the manufacturing phase at a wafer level or a package level. Accordingly, the degradation curve can be generated according to, for example, a wafer level testing result or a package level testing result. In further embodiments, the degradation curve is characterized by test results that are sampled according to a lot, a wafer, a chip, a memory block, or a group of memory blocks.

On the other hand, the degradation curve may be determined according to users' experiences. A degradation curve can be configured or determined empirically by users based on users' experiences. Alternatively stated, in some embodiments, an empirical degradation curve is encoded based on users' experiences, but not accessed from the nonvolatile memory 120.

As discussed above, the degradation curve can be stored in the nonvolatile memory 120. To perform the wear-leveling operation, the stored degradation curve can then be retrieved from the nonvolatile memory 120 according to practical requirements. In some embodiments, when at least one degradation curve is to be stored in the nonvolatile memory 120, at least one of the memory blocks B0-B(n+1) is configured to store the at least one degradation curve. For example, each one of the memory blocks B0-B(n+1) is configured to store a corresponding degradation curve. For another example, a portion of the memory blocks B0-B(n+1) are configured to store one or more corresponding degradation curves, while the rest of the memory blocks B0-B(n+1) do not store any degradation curve.

The numbers of the degradation curve and/or memory blocks corresponding to the degradation curve are not limited in the present disclosure. For example, in some embodiments, one degradation curve is configured for each one of the memory blocks B0-B(n+1), while in various embodiments, one degradation curve is configured for only a group of memory blocks in the memory blocks B0-B(n+1). The numbers of the degradation curve and/or memory blocks corresponding to the degradation curve can be determined according to how a sampled degradation curve represents the memory blocks. The degradation curve may be sampled in the manufacturing phase and then configured as nonvolatile parameter to be accessible in a storage circuit. In some embodiments, there are more than one degradation curve, and each degradation curve represents the degradation of a group of memory blocks.

The above configuration of storing the degradation curves in the memory blocks B0-B(n+1) is given for illustrative purposes. Various configurations of storing the degradation curves in the memory blocks B0-B(n+1) are within the contemplated scope of the present disclosure. For example, in various embodiments, only one of the memory blocks B0-B(n+1) is configured to store all of the degradation curves. For another example, in alternative embodiments, a portion of the memory blocks B0-B(n+1) are configured to store the required degradation curves.

With reference to FIG. 1, in some embodiments, each one of the memory blocks B0-B(n+1) includes a data area 1211 and a spare area 1212 that is different and separate from the data area 1211. The data area 1211 of each one of the memory blocks B0-B(n+1) is configured to store the bit data as discussed above. The spare area 1212 of each one of the memory blocks B0-B(n+1) is configured to store a corresponding degradation curve. In some embodiments, the spare area 1212 includes, but not limited to, redundant memory cells (not shown).

The above configurations of the data area 1211 and the spare area 1212 are given for illustrative purposes. Various configurations of the data area 1211 and the spare area 1212 are within the contemplated scope of the present disclosure. For example, in various embodiments, only one spare area 1212 in one of the memory blocks B0-B(n+1) is configured to store the degradation curve. For another example, in alternative embodiments, two or more than two, but not all, spare areas 1212 in the memory array 121 are configured to store the corresponding degradation curves.

In various embodiments, the nonvolatile memory 120 further includes a control logic circuit 125, and the control logic circuit 125 includes a register 126. The register 126 is configured to store at least one degradation curve as discussed above, while there is no degradation curve stored in the memory array 121. In some embodiments, the register 126 includes a non-volatile storage element and is configured to store one corresponding degradation curve for a memory chip. The number of the register 126 is given for illustrative purposes. Various numbers of the register 126 are within the contemplated scope of the present disclosure.

The above configuration of storing the degradation curve in the nonvolatile memory 120 is given for illustrative purposes. Various configurations of storing the degradation curve in the nonvolatile memory 120 are within the contemplated scope of the present disclosure. For example, in various embodiments, the register 126 is configured to store at least one corresponding degradation curve, while at least one spare area 1212 in the memory array 121 is also configured to store at least one corresponding degradation curve.

Figure 3:
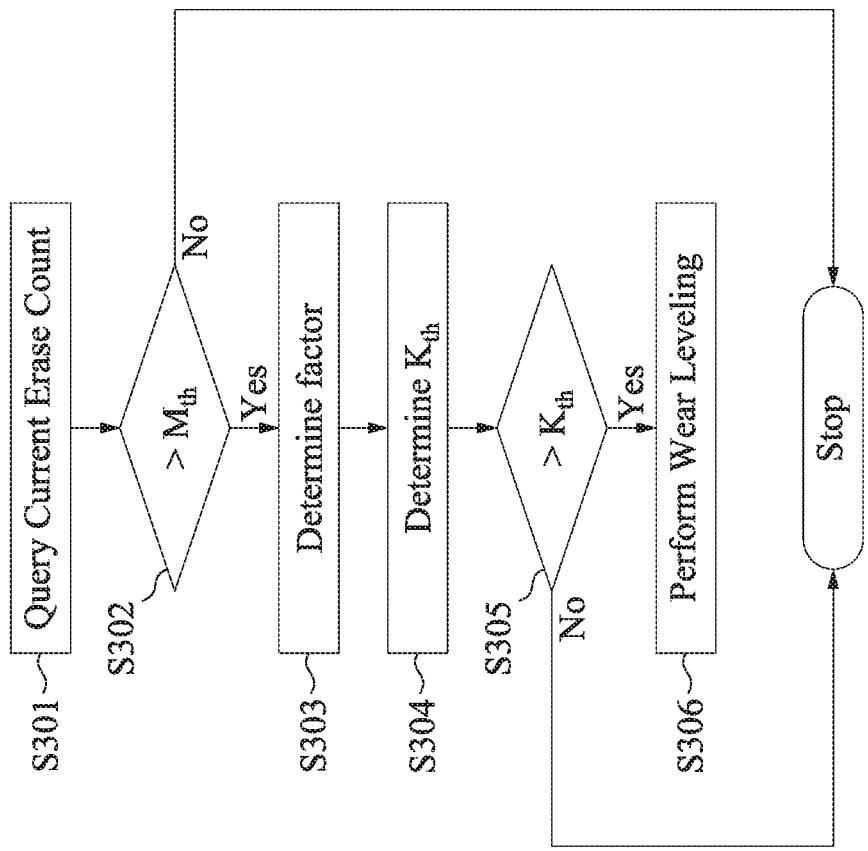
FIG. 3 is a flow chart of a method including operations with respect to a memory, in accordance with some embodiments of the present disclosure.

FIG. 3 is a flow chart of a method 300 including operations with respect to a memory, in accordance with some embodiments of the present disclosure. In some embodiments, the method 300 is applicable in the system 100 of FIG. 1. The method 300 is not limited to be applied in the system 100 of FIG. 1. However, for ease of understanding, the method 300 is discussed below with reference to the system 100 of FIG. 1. The method 300 includes operations S301-S306, each of which will be discussed below. In some embodiments, operations S301-S306 are performed by the host circuit 110.

In operation S301, a current erase count is queried. For example, with reference to FIG. 1, the current erase count associated with the memory blocks B0-B(n+1) is queried. After querying the erase count, the erase count can be acquired.

After operation S301, the acquired erase count is used for subsequent operations. In some embodiments, the acquired erase count is compared with an activation count threshold $M_{th}$, and then whether the erase count is greater than the activation count threshold $M_{th}$ is determined, as illustrated with respect to operation S302.

Subsequent to operation S302, when the erase count is not greater than the activation count threshold $M_{th}$, the method 300 stops and/or ends. Alternatively stated, it is not necessary to enable a wear leveling stage and/or perform wear leveling when there is no memory block with erase count greater than the activation count threshold $M_{th}$. Accordingly, the activation count threshold $M_{th}$ is also referred to as a minimum erase count threshold for determining whether a wear leveling stage will be enabled, in some embodiments. No wear leveling stage will be enabled when the erase count is not greater than the activation count threshold $M_{th}$, which will be exemplarily discussed below with reference to FIG. 4.

Figure 4:
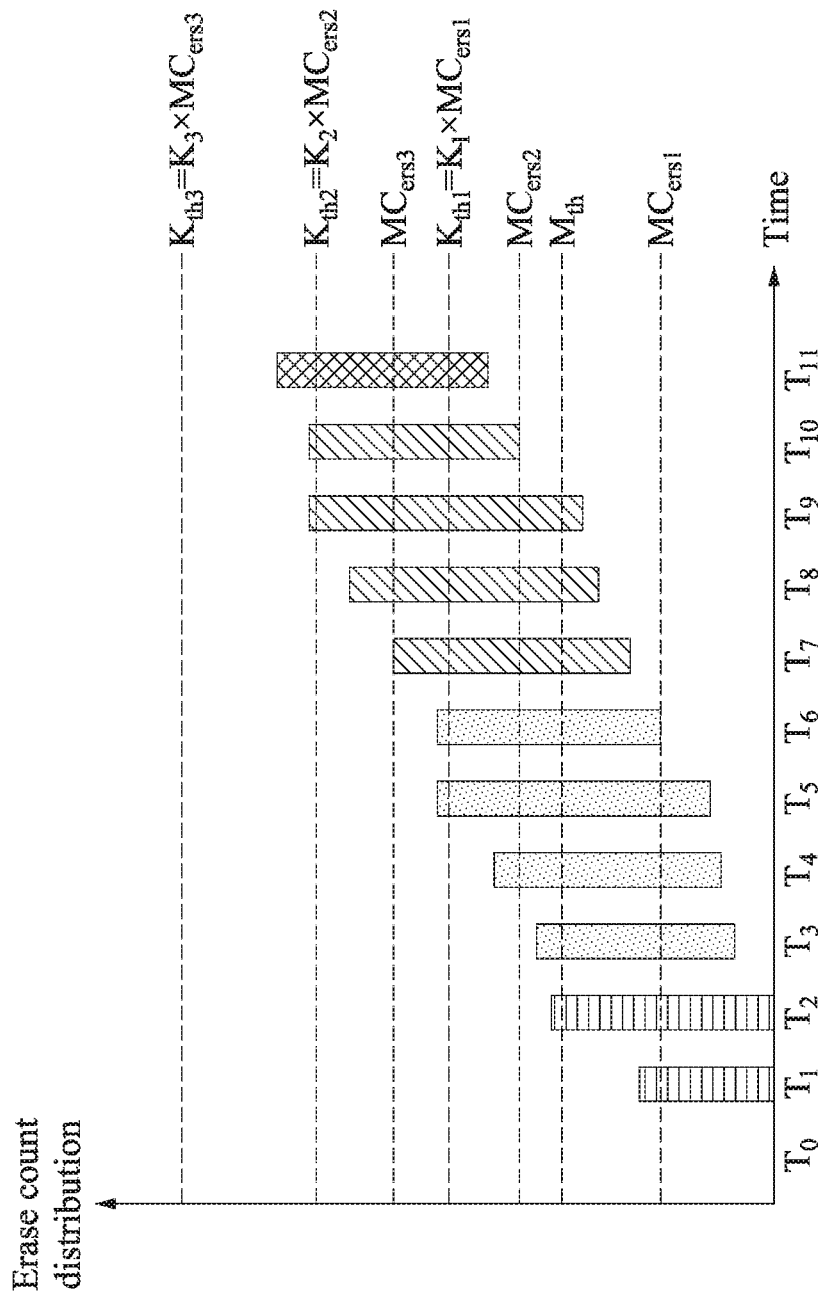
FIG. 4 is a diagram illustrating erase count distribution associated with the memory blocks in FIG. 1 along with time, in accordance with some embodiments of the present disclosure.

FIG. 4 is a diagram illustrating erase count distribution associated with the memory blocks in FIG. 1 along with time, in accordance with some embodiments of the present disclosure. As illustrated in FIG. 4, the X-axis represents different time spots corresponding to, for example, the usage of the memory blocks B0-B(n+1) of FIG. 1. The Y-axis represents the distribution of the erase counts of, for example, the memory blocks B0-B(n+1). Each distribution corresponding to a time spot indicates erase counts that range from a largest value to a smallest value. For example, the largest value corresponds to at least one of the memory blocks B0-B(n+1) that is most erase cycled, while the smallest value corresponds to at least one of the memory blocks B0-B(n+1) that is least erase cycled.

As illustrated in FIG. 4, in an initial state at time $T_0$, the erase count of all of the memory blocks B0-B(n+1) is 0. Accordingly, the distribution of the erase count of the memory blocks B0-B(n+1) is 0 at time $T_0$.

After time $T_0$, when erase operations are performed to the memory blocks B0-B(n+1), the erase count of at least one of the memory blocks B0-B(n+1) starts to increase. For example, as illustrated in FIG. 4, at time $T_1$, the distribution of the erase counts of the memory blocks B0-B(n+1) ranges from 0 to a certain value that is under the activation count threshold $M_{th}$. As discussed above, because the erase count is not greater than the activation count threshold $M_{th}$, no wear leveling stage will be enabled.

Subsequent to operation S302 of FIG. 3, on the other hand, when the erase count is greater than the activation count threshold $M_{th}$, operation S303 is performed subsequently to determine a factor K. The factor K is configured for determining a top erase count threshold $K_{th}$, which will be discussed below with respect to operation S304.

In some embodiments, the factor K is a dynamic factor dependent on an average erase count that is associated with the memory blocks B0-B(n+1). For example, the above average erase count can be derived from the degradation curve as discussed above with respect to FIG. 2. In various embodiments, the factor K is derived according to the degradation curve as well as the requirement of the span of the degradation of the memory blocks B0-B(n+1) in FIG. 1, for example a span of the degradation by 0.3V.

In operation S304, a top erase count threshold $K_{th}$ is determined according to the degradation curve as discussed above. In some embodiments, the top erase count threshold $K_{th}$ is equal to a multiplication of a bottom erase count threshold $MC_{ers}$ by the factor K as discussed above. Alternatively stated, the top erase count threshold $K_{th}$ can be determined by the formula of $K_{th}=K\times MC_{ers}$.

Also as illustrated in FIG. 2, a wear leveling stage may correspond to a section of the degradation curve between, for example, a threshold voltage of −3 volts and a threshold voltage of −2.7 volts, or −2.8 and −2.5V, and so forth on the Y-axis. Explained in a different way, a wear leveling stage may correspond to, for example, a degradation of threshold voltage of 0.3 volts, along with the increase of the erase count. The above degradation of threshold voltage is given for illustrative purposes. Various degradations of threshold voltage corresponding to the increase of the erase count are within the contemplated scope of the present disclosure. For example, in various embodiments, a wear leveling stage may correspond to a degradation of threshold voltage of 0.5 volts, along with the increase of the erase count.

The above section of the degradation curve, illustrated between two dots on the degradation curve of FIG. 2, also corresponds to the erase counts on the X-axis. In some embodiments, the erase counts corresponding to the two dots can be defined as the bottom erase count threshold $MC_{ers}$ and the top erase count threshold $K_{th}$, respectively. They are determined directly by the required uniformity of degradation distribution according to the degradation curve, for example, 0.3V. Of course, the corresponding K could be derived accordingly but not necessary because the $MC_{ers}$ and $K_{th}$ are information used to control the uniformity of the degradation in this invention. And K is only helpful to model the degradation behavior simply but not mandatory.

With reference to FIG. 4, at time $T_2$, for example, the erase count of one of the memory blocks B0-B(n+1) is greater than the activation count threshold $M_{th}$. As discussed above, because the erase count is greater than the activation count threshold $M_{th}$, the top erase count threshold $K_{th}$ is determined accordingly either by the factor K or directly from the degradation curve by the required uniformity of degradation, for example, at time $T_2$, or after time $T_2$. As shown in FIG. 4, when the factor is $K_1$ and the bottom erase count threshold $M_{Cers1}$, the top erase count threshold is $K_{th1}$, and $K_{th1}=K_1\times M_{Cers1}$.

The above determinations of the top erase count threshold $K_{th}$ and the bottom erase count threshold $MC_{ers}$ are given for illustrative purposes. Various determinations of the top erase count threshold $K_{th}$ and the bottom erase count threshold $MC_{ers}$ are within the contemplated scope of the present disclosure. For example, in various embodiments, the factor K is constant in all stages, and the top erase count threshold $K_{th}$ for each stage can be easily obtained without detailing the degradation curve. In such embodiments, the top erase count threshold $K_{th}$ can still be obtained without the degradation curve.

Referring back to FIG. 3, after operation S304, a maximum erase count associated with the memory blocks B0-B(n+1) is compared with the top erase count threshold $K_{th}$, and then whether the maximum erase count is greater than the top erase count threshold $K_{th}$ is determined, as illustrated with respect to operation S305.

Subsequent to operation S305, when the maximum erase count is not greater than the top erase count threshold $K_{th}$, the method 300 stops and/or ends. On the other hand, when the maximum erase count is greater than the top erase count threshold $K_{th}$, operation S306 is performed. In operation S306, at least one wear leveling operation is performed to at least one of the memory blocks B0-B(n+1). In the embodiments with reference to FIG. 1, the host circuit 110 is configured to perform at least one wear leveling operation to at least one of the memory blocks B0-B(n+1).

With reference to FIG. 4, for example at time $T_3$ and time $T_4$, the maximum erase count is not greater than the top erase count threshold $K_{th1}$. Accordingly, no wear leveling operation is to be performed. Afterwards, for example at time $T_5$, the maximum erase count is greater than the top erase count threshold $K_{th1}$. Accordingly, the wear leveling operation is performed, for example, at time $T_5$, or after time $T_5$.

In some embodiments, the wear leveling operation as discussed above is performed under the condition that the erase count of the most erase cycled memory block hit the top erase count threshold $K_{th}$ and the erase counts of some memory blocks are still smaller than the bottom erase count threshold $MC_{ers}$. As the erase operations will still be performed, the distribution of erase counts of memory blocks 110 will finally be confined in between the top erase count threshold $K_{th}$ and the bottom erase count threshold $MC_{ers}$. In this situation, it is time to move to a next wear leveling stage, in which a new pair of top and bottom erase count threshold is determined according to the degradation curve, which will be discussed below with reference to FIG. 5.

Figure 5:
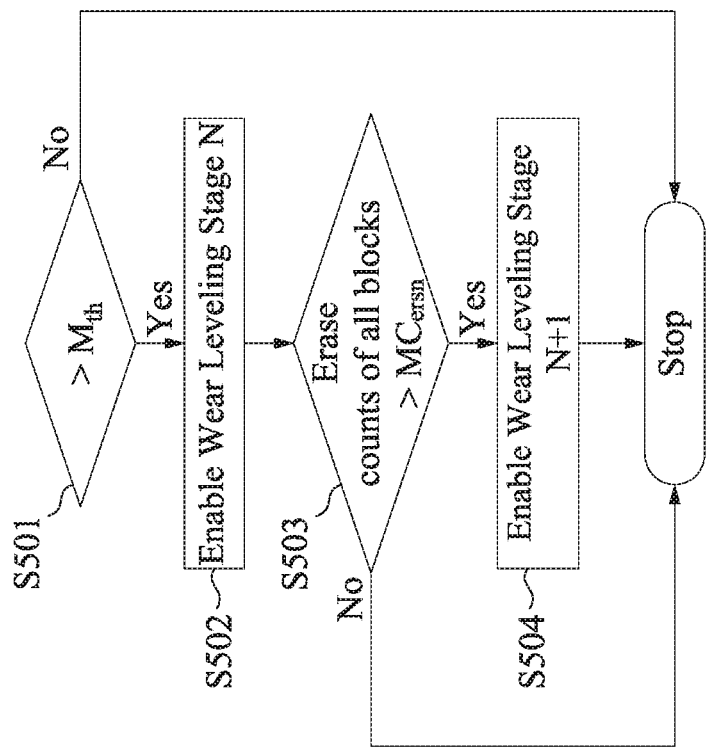
FIG. 5 is a flow chart illustrating a method of switching between different wear leveling stages, in accordance with some embodiments of the present disclosure.

FIG. 5 is a flow chart illustrating a method 500 of switching between different wear leveling stages, in accordance with some embodiments of the present disclosure. In some embodiments, the method 500 is applicable in the system 100 of FIG. 1. However, the method 500 is not limited to be applied in the system 100 of FIG. 1. For ease of understanding, the method 500 is discussed below with reference to FIG. 4. The method 500 includes operations S501-S504, each of which will be discussed below. In some embodiments, operations S501-S504 are performed by the host circuit 110.

In operation S501, similar to operation S302 of FIG. 3, the acquired erase count is compared with the activation count threshold $M_{th}$, and then whether the erase count is greater than the activation count threshold $M_{th}$ is determined.

Subsequent to operation S501, when the erase count is not greater than the activation count threshold $M_{th}$, the method 500 stops and/or ends. On the other hand, when the erase count is greater than the activation count threshold $M_{th}$, operation S502 is performed, in which a wear leveling stage N is enabled. In some embodiments, the wear leveling stage N corresponds to at least some operations including, for example, operations S303-S306, as illustrated in FIG. 3. Alternatively stated, the method 300 of FIG. 3 may correspond to a single wear leveling stage.

Afterwards, in operation S503, erase counts associated with all of the memory blocks are compared with the bottom erase count threshold $MC_{ersn}$, and whether the erase counts associated with all of the memory blocks are greater than the bottom erase count threshold $MC_{ersn}$ is determined. In such embodiments, the bottom erase count threshold $MC_{ersn}$ is a bottom erase count threshold determined at the wear leveling stage N, and is different from the bottom erase count thresholds determined at other wear leveling stages.

Subsequent to operation S503, when the erase counts associated with all of the memory blocks are not all greater than the bottom erase count threshold $MC_{ersn}$, the method 500 stops and/or ends. On the other hand, when the erase counts associated with all of the memory blocks are greater than the bottom erase count threshold $MC_{ersn}$, operation S504 is performed, in which a wear leveling stage N+1 following the wear leveling stage N is enabled and new $MC_{ers}$ and $K_{th}$ in the stage N+1 are determined accordingly.

As illustrated with reference to FIG. 4, when N=1 and the wear leveling stage 1 is enabled, the factor $K_1$, the top erase count threshold $K_{th1}$, and the bottom erase count threshold $MC_{ers1}$, corresponding to the wear leveling stage 1, are determined. For example, various erase count distributions in the wear leveling stage 1 correspond to time $T_3$, $T_4$, $T_5$, and before $T_6$. As discussed above, at time $T_5$ or after time $T_5$, the wear leveling operation is performed, because the maximum erase count is greater than the top erase count threshold $K_{th1}$. Then, when the erase counts associated with all of the memory blocks are greater than the bottom erase count threshold $MC_{ers1}$, for example at time $T_6$, a wear leveling stage 2 following the wear leveling stage 1 is enabled, as discussed above with respect to FIG. 5.

In the wear leveling stage 2, the factor $K_2$, the top erase count threshold $K_{th2}$, and the bottom erase count threshold $MC_{ers2}$, corresponding to the wear leveling stage 2, are determined. Similarly, $K_2$, $MC_{ers2}$, and $K_{th2}$ (=$K_2 \times MC_{ers2}$) can be determined as discussed above with respect to the method 300, in which $K_{th2}$ is greater than $K_{th1}$, and $MC_{ers2}$ is greater than $MC_{ers1}$. After the top erase count threshold $K_{th1}$ is determined, operations S305 and S306 in FIG. 3 can be performed again in the wear leveling stage 2 based on the top erase count threshold $K_{th2}$.

For example in FIG. 4, various erase count distributions in the wear leveling stage 2 correspond to time $T_7$, $T_8$, $T_9$, and before $T_{10}$. Similarly, at time $T_9$ or after time $T_9$, the wear leveling operation is performed, because the maximum erase count is greater than the top erase count threshold $K_{th2}$. Then, when the erase counts associated with all of the memory blocks are greater than the bottom erase count threshold $MC_{ers2}$, for example at time $T_{10}$, a wear leveling stage 3 following the wear leveling stage 2 is enabled, as discussed above with respect to FIG. 5.

In the wear leveling stage 3, the factor $K_3$, the top erase count threshold $K_{th3}$, and the bottom erase count threshold $MC_{ers3}$, corresponding to the wear leveling stage 3, are determined, as shown in FIG. 4. Similarly, $K_3$, $MC_{ers3}$, and $K_{th3}$ (=$K_3 \times MC_{ers3}$) can be determined as discussed above with respect to the method 300, in which $K_{th3}$ is greater than $K_{th2}$, and $MC_{ers3}$ is greater than $MC_{ers2}$. After the top erase count threshold $K_{th3}$ is determined, operations S305 and S306 in FIG. 3 can be performed again in the wear leveling stage 3 based on the top erase count threshold $K_{th3}$.

Based on the above, once no erase count of the memory blocks is smaller than the bottom erase count threshold $MC_{ersn}$, the operation flow moves to a next wear leveling stage and a new pair of top and bottom erase count thresholds is determined. Alternatively stated, the top erase count threshold Kai and the bottom erase count threshold $MC_{ers}$ are dynamically adjusted for each corresponding wear leveling stage, in order to determine whether the wear leveling operation is to be performed in the corresponding wear leveling stage.

The above operations with respect to FIG. 4 are given for illustrative purposes and, for simplicity of illustration, only operations corresponding to time $T_0$-$T_{11}$ are shown. Corresponding operations after time $T_{11}$ are within the contemplated scope of the present disclosure, and they are deduced by analogy. Accordingly, operations after time $T_{11}$ are not further detailed herein.

Figure 6:
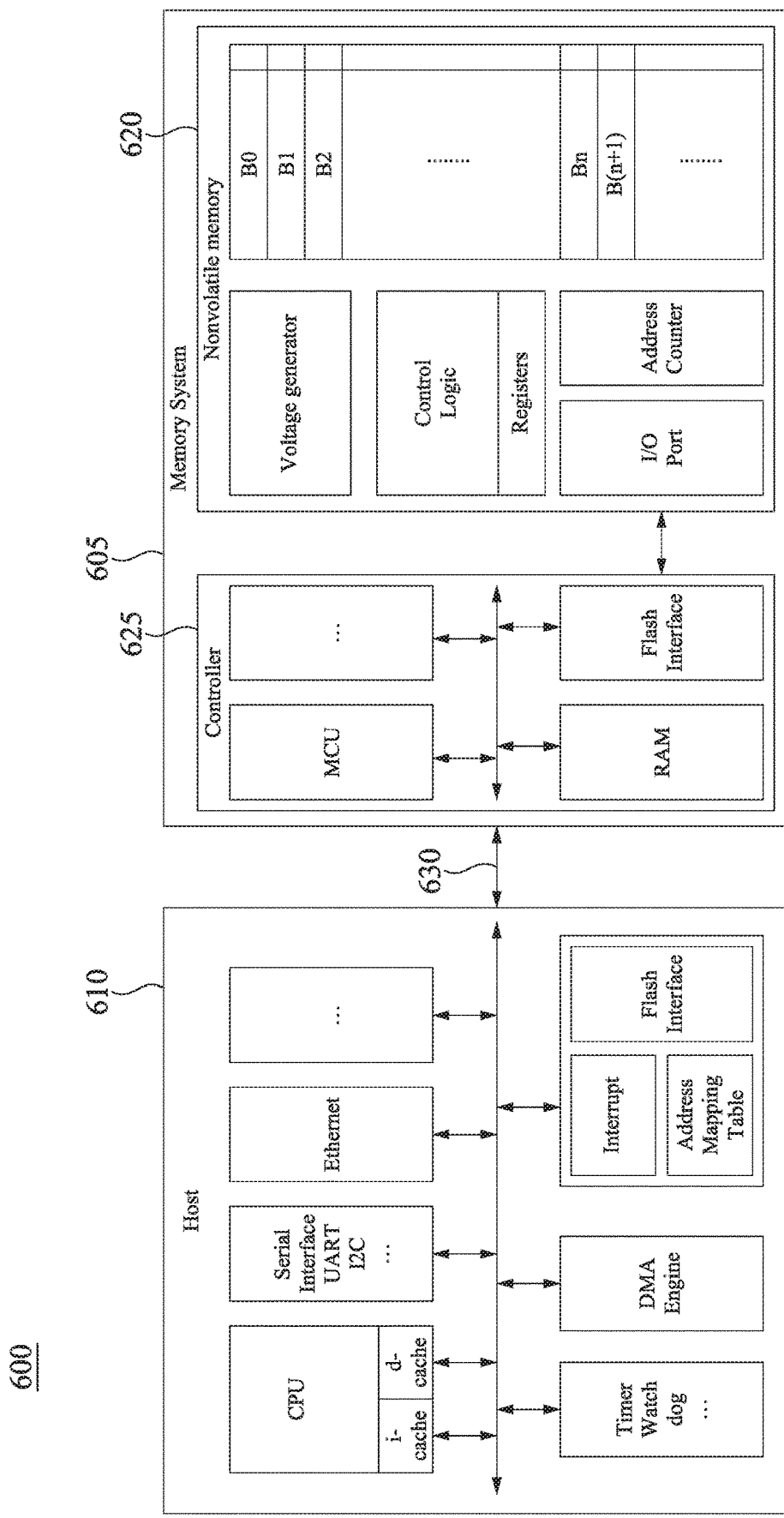
FIG. 6 is a circuit block diagram of a system in accordance with various embodiments of the present disclosure.

FIG. 6 is a circuit block diagram of a system 600 in accordance with various embodiments of the present disclosure. As illustrated in FIG. 6, the system 600 includes a host circuit 610 and a memory system 605 that is separate from the host circuit 610. The host circuit 610 is coupled to the memory system 605, and communicates with the memory system 605 through a system bus 630. As illustrated in FIG. 6, the memory system 605 includes a controller 625 and a nonvolatile memory 620 which communicates with the controller 625. The controller 625 is configured to operate in response to corresponding memory commands issued by the host circuit 610. The host circuit 610 is configured to communicate with the controller 625 through the system bus 630, and configured to control the controller 625 to perform the at least one wear leveling operation as discussed above. In some embodiments, the memory system 605 is implemented in an Embedded Multi Media Card (eMMC) device, a USB driver, a solid state SATA storage, or the like.

Compared to the system 100 of FIG. 1, the host circuit 610 and the nonvolatile memory 620 of FIG. 6 correspond to the host circuit 110 and the nonvolatile memory 120 of FIG. 1, but the nonvolatile memory 620 is included in the memory system 605 with the controller 625. Similarly, in some embodiments, the nonvolatile memory 620 is implemented by a flash memory, but not limited thereto.

In some embodiments, the controller 625 is configured to control a series of operations including, for example, reading, writing, and updating data files. For example, the controller 625 analyzes a data file, which is outputted from the nonvolatile memory 620, in compliance with a control command of the host circuit 610. The controller 625 also manages and controls a data file inputted into, or outputted from, the nonvolatile memory 620. For example, the data file that is inputted into the nonvolatile memory 620 is stored and/or erased.

Furthermore, the above operations with respect to FIGS. 3-5 also can be applied in the system 600. For example, in some embodiments, the controller 625 in the memory system 605 is configured to execute the wear leveling method as discussed above, to the nonvolatile memory 620.

In this document, the term "coupled" may also be termed as "electrically coupled," and the term "connected" may be termed as "electrically connected". "Coupled" and "connected" may also be used to indicate that two or more elements cooperate or interact with each other.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system, comprising:
   a nonvolatile memory comprising a plurality of memory blocks; and
   a controller configured to perform at least one wear leveling operation, based on at least one degradation curve, to at least one of the plurality of memory blocks;
   wherein the at least one degradation curve indicates a degradation of a threshold voltage of the at least one of the plurality of memory blocks along with an increase of an erase count associated with the at least one of the plurality of memory blocks.

2. The system of claim 1, wherein the at least one degradation curve is associated with the plurality of memory blocks.

3. The system of claim 1, wherein the nonvolatile memory further comprises at least one register, and the at least one register is configured to store the at least one degradation curve.

4. The system of claim 1, wherein the plurality of memory blocks include data areas and spare areas different from the data areas, and the nonvolatile memory is configured to store the at least one degradation curve in at least one of the spare areas.

5. The system of claim 1, wherein when a maximum erase count associated with the plurality of memory blocks is greater than a first erase count threshold, the controller is configured to perform the at least one wear leveling operation to the at least one of the plurality of memory blocks based on the at least one degradation curve.

6. The system of claim 5, wherein the first erase count threshold is determined by a second erase count threshold and uniformity of degradation distribution according to the at least one degradation curve.

7. The system of claim 5, wherein a predetermined factor is configured as a multiplier for the first erase count threshold to multiply the second erase count threshold.

8. The system of claim 7, wherein the predetermined factor corresponds to a range of degradation distribution of the threshold voltage of the at least one of the plurality of memory blocks.

9. The system of claim 1, wherein the controller is implemented by a host circuit that is configured to communicate with the nonvolatile memory through a system bus.

10. The system of claim 1, further comprising:
a host circuit configured to communicate with the controller through a system bus, and configured to control the controller to perform the at least one wear leveling operation.

11. A method, comprising:
comparing a maximum erase count associated with a plurality of memory blocks in a nonvolatile memory with a first erase count threshold that is determined based on at least one degradation curve; and
when the maximum erase count is greater than the first erase count threshold, performing at least one wear leveling operation to at least one of the plurality of memory blocks;
wherein the at least one degradation curve indicates a degradation of a threshold voltage of the at least one of the plurality of memory blocks along with an increase of an erase count associated with the at least one of the plurality of memory blocks.

12. The method of claim 11, wherein the at least one degradation curve is associated with the plurality of memory blocks.

13. The method of claim 11, further comprising:
determining the first erase count threshold by a second erase count threshold and required uniformity of degradation distribution according to the at least one degradation curve.

14. The method of claim 11, further comprising:
obtaining the first erase count threshold by multiplying a predetermined factor configured as a multiplier, with the second erase count threshold.

15. The method of claim 14, wherein the predetermined factor corresponds to a range of degradation distribution of the threshold voltage of the at least one of the plurality of memory blocks.

16. The method of claim 11, wherein the at least one wear leveling operation is performed in a first wear leveling stage, and
the method further comprises:
comparing erase counts associated with the plurality of memory blocks with a second erase count threshold, wherein the first erase count threshold is greater than the second erase count threshold; and
when the erase counts associated with the plurality of memory blocks are greater than the second erase count threshold, enabling a second wear leveling stage that follows the first wear leveling stage in time.

17. The method of claim 16, further comprising:
in the second wear leveling stage,
comparing the maximum erase count associated with the plurality of memory blocks with a third erase count threshold that is determined based on the at least one degradation curve associated with the plurality of memory blocks, wherein the third erase count threshold is greater than the first erase count threshold; and
when the maximum erase count is greater than the third erase count threshold, performing the at least one wear leveling operation to the at least one of the plurality of memory blocks.

18. The method of claim 11, further comprising:
dynamically adjusting the first count threshold based on the at least one degradation curve;
wherein the adjusted first count threshold is determined by multiplying a second erase count threshold by a predetermined factor, and
the predetermined factor is derived according to the at least one degradation curve.

19. A method, comprising:
comparing erase counts associated with a plurality of memory blocks in a nonvolatile memory with an activation count threshold;
when one of the erase counts is greater than the activation count threshold, determining a first erase count threshold according to at least one degradation curve associated with the plurality of memory blocks;
comparing a maximum erase count associated with the plurality of memory blocks with the first erase count threshold; and
when the maximum erase count is greater than the first erase count threshold, performing at least one wear leveling operation to at least one of the plurality of memory blocks;
wherein the at least one degradation curve indicates a degradation of a threshold voltage of the at least one of the plurality of memory blocks along with an increase of an erase count associated with the at least one of the plurality of memory blocks.

20. The method of claim 19, wherein the operations of comparing and determining and the at least one wear leveling operation are performed in a first wear leveling stage, and
the method further comprises:
comparing the erase counts associated with the plurality of memory blocks with a second erase count threshold, wherein the first erase count threshold is greater than the second erase count threshold; and when the erase counts associated with the plurality of memory blocks are greater than the second erase count threshold, enabling a second wear leveling stage that follows the first wear leveling stage in time.

21. The method of claim 20, further comprising:
in the second wear leveling stage, performing the operations of comparing and determining and the at least one wear leveling operation.

\* \* \* \* \*